United States Patent
Sayuk et al.

(10) Patent No.: US 6,278,169 B1
(45) Date of Patent: Aug. 21, 2001

(54) IMAGE SENSOR SHIELDING

(75) Inventors: Mark Sayuk, Waltham, MA (US);
Steve Decker, Derry, NH (US);
Dahong Qian, Westford, MA (US);
Anne Deignan, Raheen; Dave Bain, Adare, both of (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/188,857

(22) Filed: Nov. 9, 1998

Related U.S. Application Data

(63) Continuation of application No. 09/074,204, filed on May 7, 1998.

(51) Int. Cl.$^7$ .................... H01L 31/0232; H01L 31/062
(52) U.S. Cl. ........................................ 257/435; 257/294
(58) Field of Search ............................ 257/435, 59, 294

(56) References Cited

U.S. PATENT DOCUMENTS

| | | | |
|---|---|---|---|
| 5,298,733 | * 3/1994 | Ehmke et al. | 250/208.1 |
| 5,504,355 | 4/1996 | Hatano | 357/335 |
| 5,523,609 | 6/1996 | Fukusho | 257/435 |
| 5,536,950 | * 7/1996 | Liu et al. | 257/59 |
| 5,565,374 | 10/1996 | Fukusho | 437/53 |
| 5,585,653 | 12/1996 | Nakashiba | 257/232 |
| 5,774,182 | 6/1998 | Mutoh et al. | 348/311 |
| 5,780,840 | 7/1998 | Lee et al. | 250/208.1 |
| 5,780,914 | 7/1998 | Kim | 257/435 |
| 5,818,095 | * 10/1998 | Sampsell | 257/435 |
| 6,057,586 | * 5/2000 | Bawlock et al. | 257/435 |

FOREIGN PATENT DOCUMENTS

| | | | |
|---|---|---|---|
| 0 222 338 A2 | * 7/1986 | (EP) | 257/435 |
| 0 518 868 A1 | * 6/1992 | (EP) | 257/435 |
| 4-56274 | * 2/1992 | (JP) | 257/435 |

OTHER PUBLICATIONS

"MOS Color Image Sensor", Camera and Camcorder Video Circuits (VHS and 8MM), Chapter 7, 7.1.5. to 7.1.7, pp. 7.12–7/17.

* cited by examiner

*Primary Examiner*—Long Pham
*Assistant Examiner*—William David Coleman
(74) *Attorney, Agent, or Firm*—Wolf, Greenfield & Sacks, P.C.

(57) ABSTRACT

A method of shielding light from rows and columns of an array of pixels of a CMOS image sensor includes the steps of: providing a first layer of metal shielding above the rows and columns of the array; and providing a second layer of metal shielding above the first layer. The method further includes forming slots within each of the first and second layers of metal shielding, such that the slots of the first layer are misaligned with the slots of the second layer. A light shield for shielding columns and rows of an array of pixels in a CMOS image sensor includes a first metal layer located above the columns and rows of the array, and a second metal layer located above the first metal layer. Each of the first and second metal layers includes slots. The slots are formed such that the slots of the first layer are misaligned with the slots of the second layer.

24 Claims, 4 Drawing Sheets

IMAGE SENSOR SHIELDING

This application is a continuation of application Ser. No. 09/074,204, filed May 7, 1998, entitled IMAGE SENSOR SHIELDING, and now pending.

FIELD OF THE INVENTION

The present invention relates generally to image sensors, and more particularly, to a technique for shielding portions of pixel arrays from light within image sensors.

BACKGROUND OF THE INVENTION

Image sensors are solid state devices used in image acquisition applications. As examples, digital cameras, camcorders and video conferencing machines employ image sensors. Image sensors typically are implemented in an integrated circuit (IC) and include an array of pixels, each pixel being sensitive to received light. A pixel typically produces a voltage which is linearly dependent on the intensity of light it receives. A pixel may be formed of a semiconductor device and particularly from a p/n junction portion of the device. A photocharge generator, within the depletion region of the p/n junction, generates current in response to light received, which current is converted to a voltage.

Shielding light from a portion of the pixels in the array is required for a number of reasons. Typically, several rows and several columns of the array of pixels require shielding. One reason for requiring the shielding is that each pixel from which an output voltage is read requires a dark reference pixel, an output voltage of which is used a dark pixel reference voltage. The signal produced by the dark reference pixel is that ideally produced in the absence of light. Thus, for each row of pixels, there is at least one pixel which requires light shielding so as to act as the dark reference pixel for that row of reference pixels.

Another reason why shielding may be required is that the sensor may be covered by glass and subsequently exposed to light. Circuits peripheral (located adjacent) to the image sensor may be sensitive to light and require operation in the absence of light. As such, those peripheral circuits also require shielding. Further, the semiconductor substrate, on which the pixels are formed, should be shielded from light in order to avoid a photocharge generated on the substrate being collected by the pixels.

Prior art image sensors, often formed as charge-coupled devices (CCDs) using a different process from the standard Complementary Metal-Oxide Semiconductor ("CMOS") processes, typically use a single layer of metal as the light shield. The metal layer is formed to cover the particular rows and columns of the pixel array to be shielded. The quality of the metal shield is important for accurate performance of the image sensor. If the output produced by dark reference pixels is not accurate, which may occur if light reaches the substrate on which the pixel is formed, then the entire row or column, the pixel outputs of which are compared to the dark reference pixel, may produce inaccurate results.

FIG. 1 is a conceptual diagram illustrating a portion of an image sensor including an array 10 of pixels $P_n$. The array includes twenty-three rows R1–R23 and twenty-three columns C1–C23 of pixels, the pixels being numbered from P1 to P529. Each row Rn of pixels is controlled by row control logic 12. Similarly, each column Cn of pixels is controlled by column control logic 14. Column control logic 14 provides an output to buffer 16. Row control logic 12 and column control logic 14 also may be shielded (not shown).

As shown by shading, the left-most three columns C1–C3 and the upper-most three rows R1–R3 require shielding to provide dark reference pixels for the remaining pixels in those columns and rows.

SUMMARY OF THE INVENTION

The Applicants herein have recognized drawbacks with the prior art shielding approach. For one, the metal layer used for shielding, which is deposited on the top of an unplanarized surface of pixels or circuits, may crack, especially at the steep steps of the surface. Light then may travel through the crack formed and cause faulty image sensor performance.

Applicants also have recognized that, for submicron CMOS processes, i.e., 0.5 $\mu$m and smaller CMOS processes, the width of a single layer of metal required to shield the rows and columns of the pixel array and adjacent circuitry, would violate the CMOS process "design rule". For a particular CMOS process, the design rule requires that each metal layer within the IC should never be wider then a specified amount without an opening or slot. The width is reduced as the process size is reduced.

As an example, for a 0.5 $\mu$m CMOS process, the design rule may require that the maximum solid width of any one layer of metal be less than 30 $\mu$m. Otherwise reliability problems such as metal lift-off and metal-metal dielectric breakdown may occur. If each pixel in the array is approximately 8 $\mu$m×8 $\mu$m, and 20 columns are to be shielded, then the entire width of columns to be shielded is 160 $\mu$m. A single continuous metal layer, as was used in prior art CCD image sensors, would not be available as it would violate the process design rule for such a submicron process.

Most prior art CCD image sensors use different but more expensive processes than CMOS process with a minimum feature size ranging from 0.8 $\mu$m to 2 $\mu$m, most commonly 1 $\mu$m or 1.2 $\mu$m modified CMOS. For such CCD modified CMOS processes, the metal maximum width rule may not be applicable.

A general metalization problem in the industry is that of delarnination, i.e., the various layers of the dielectrics and metals peel away causing reliability problems. There are many possible causes for this delamination, some of which are process-related and some of which are package-related.

CMOS process design rules attempt to combat the problem, requiring a slot or opening at spaced intervals in each metal layer. The presence of the opening allows the overlying dielectric to anchor the underlying dielectric, giving it greater stability.

The present invention proposes using at least two layers of metal shielding, each of which would not violate the particular CMOS process design rule, in combination to accomplish the shielding required.

One embodiment of the present invention is directed to a method of shielding light from rows and columns of an array of pixels and adjacent circuitry of a CMOS image sensor comprising the steps of: providing a first layer of metal shielding above the rows and columns of the array; and providing a second layer of metal shielding above the first layer.

In an embodiment, the method further includes the steps of forming slots within each of the first and second layers of metal shielding.

In an embodiment, the steps of forming includes the steps of forming such that slots within the first layer are misaligned with slots within the second layer.

In an embodiment, the method further includes the step of providing vias interconnecting the first and second layers.

In an embodiment, the method further includes the step of providing an antireflective coating on the top surface of the first layer. In an embodiment, the method further includes the step of providing an antireflective coating on the bottom surface of the second layer.

Another embodiment of the invention is directed to a light shield for shielding columns and rows of an array of pixels and adjacent circuitry in a CMOS image sensor. A first metal layer is located above the columns and rows of the array. A second metal layer is located above the first metal layer.

In an embodiment, each of the first and second metal layers includes slots.

In an embodiment, the slots are located such that the slots of the first layer are misaligned with the slots of the second layer.

In an embodiment, the shield further includes a plurality of vias interconnecting the first and second layers.

In an embodiment, the shield includes an antireflective coating on the top surface of the first layer. In an embodiment, the shield further includes an antireflective coating on the bottom surface of the second layer. In an embodiment, the antireflective coating includes Titanium Nitride.

Another embodiment is directed to a CMOS image sensor including an array of pixels. A first metal shield layer is located over certain columns and rows of the array. A second metal shield layer is located over the first layer. A layer of insulation is located between the metal shield layers.

The features and advantages of the present invention should be more readily understood and apparent from the following detailed description of the invention, which should be read in conjunction with the accompanying drawings and from the claims which are appended to the end of the detailed description.

BRIEF DESCRIPTION OF THE DRAWING

For a better understanding of the present invention, reference is made to the accompanying drawings, which are incorporated herein by reference and in which.

DETAILED DESCRIPTION

The present invention includes using at least two separate metal layers of shielding, one above the other, to shield the required rows and columns of a pixel array in a submicron CMOS process. Each layer would include slots at predefined locations such that the layer would not violate the particular CMOS process design rule.

Current CMOS processes provide multiple layers of metal. For examples, a 0.5 $\mu$m process can have up to three layers of metal and a 0.25 $\mu$m process can have up to five layers of metal.

Figure 1:
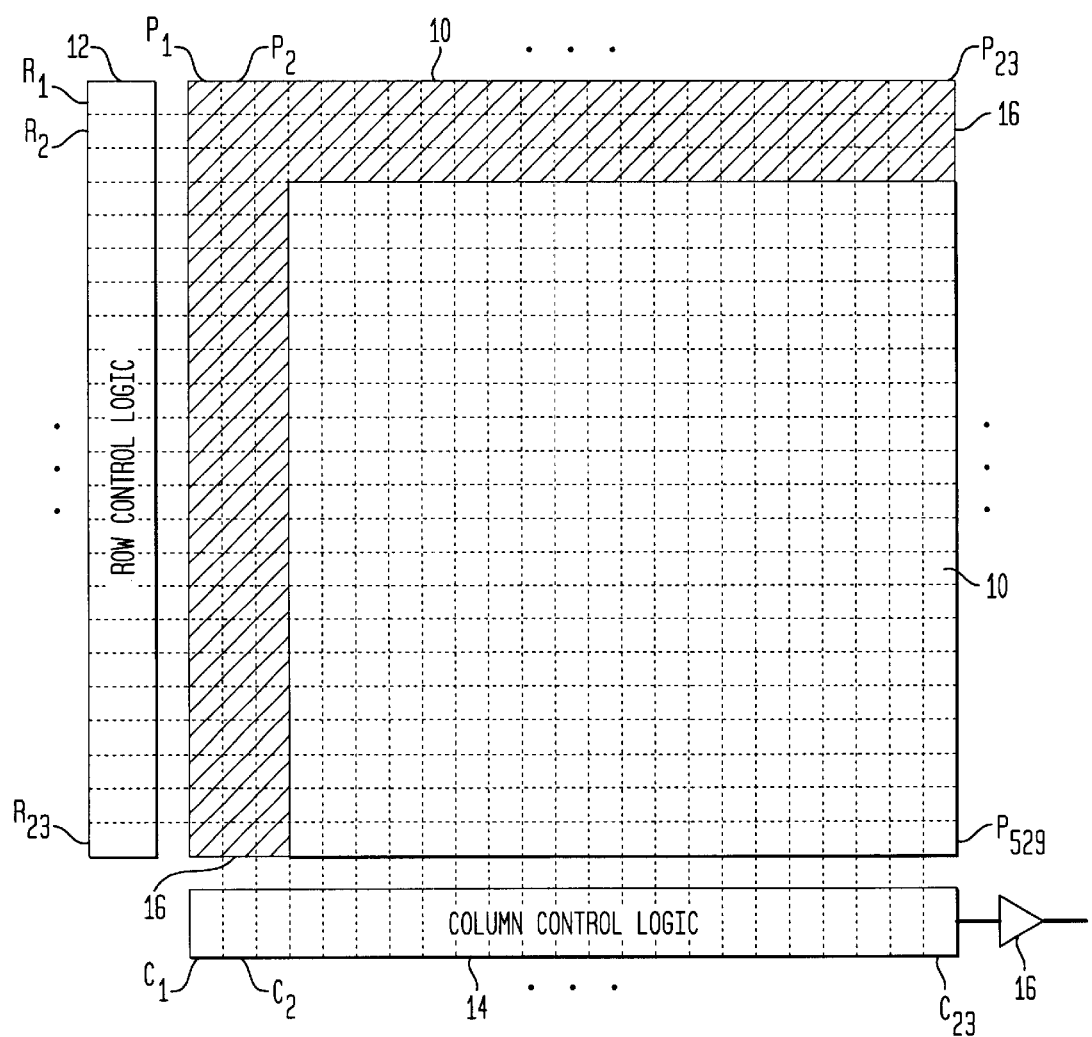
FIG. 1 is a conceptual diagram of a portion of an image sensor including an array of pixels.
Figure 2:
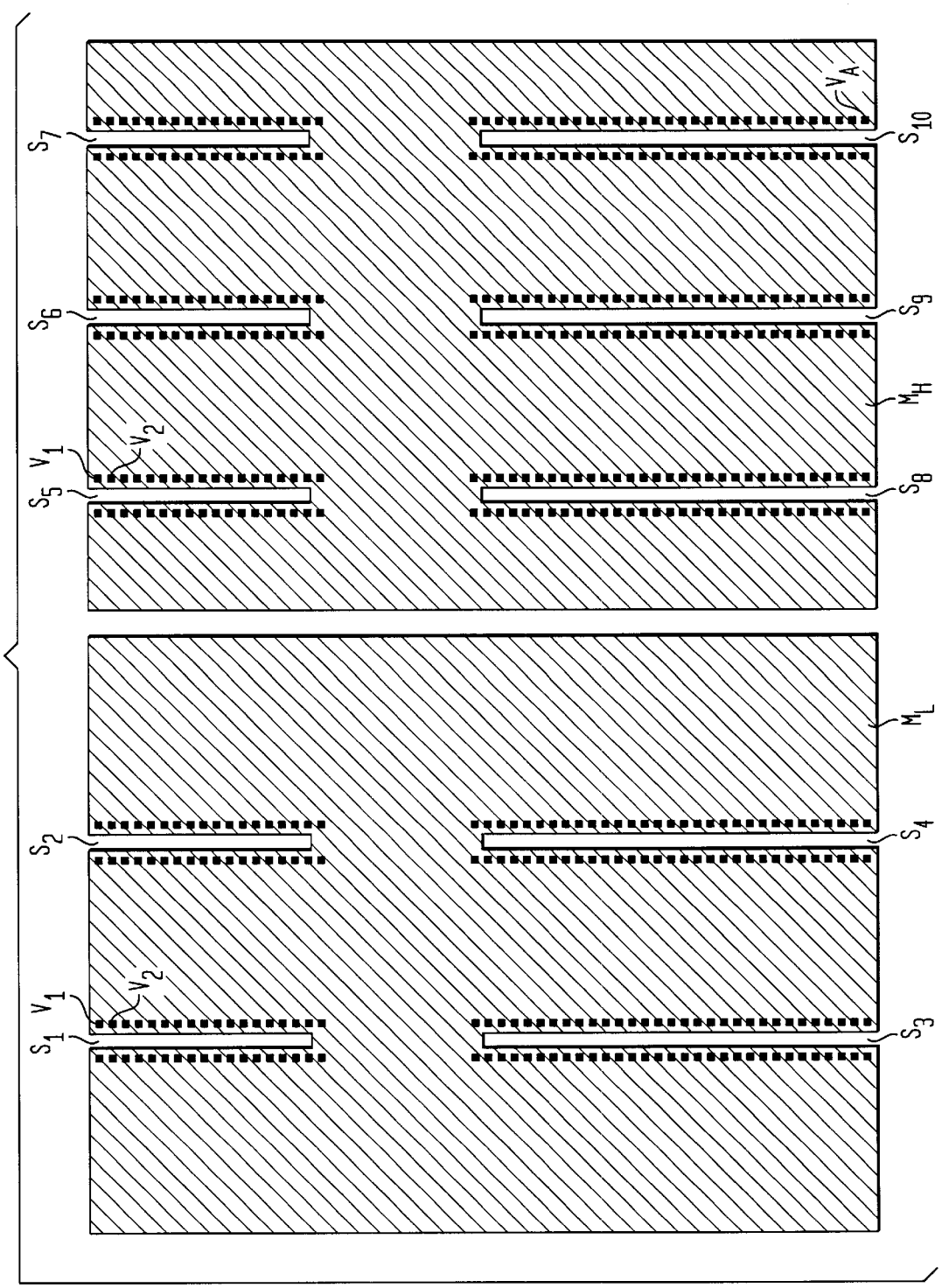
FIG. 2 is a diagram showing two layers of metal shielding according to an embodiment of the invention.

FIG. 2 is a diagram illustrating a lower layer of metal $M_L$ and an upper layer of metal $M_U$. The lower layer of metal $M_L$ includes slots S1, S2, S3 and S4 formed at locations such that it does not include greater than the maximum width of continuous metal area, as defined by the particular CMOS process design rule. Similarly, upper metal layer $M_U$ includes slots $S_5$, $S_6$, $S_7$, $S_8$, $S_9$, and $S_{10}$ such that layer $M_U$ also does not violate the particular design rule. The layers and slots are not drawn to scale. Layer $M_U$ would be located above layer $M_L$ in the image sensor IC with a passivation (insulation) layer between the two.

Also shown as dark squares are multiple vias labeled $V_1$, $V_2$, ... Vi, Vj, ... Vn. The vias would interconnect the two layers and serve to prevent excess light from reaching the substrate, as discussed below.

Figure 3:
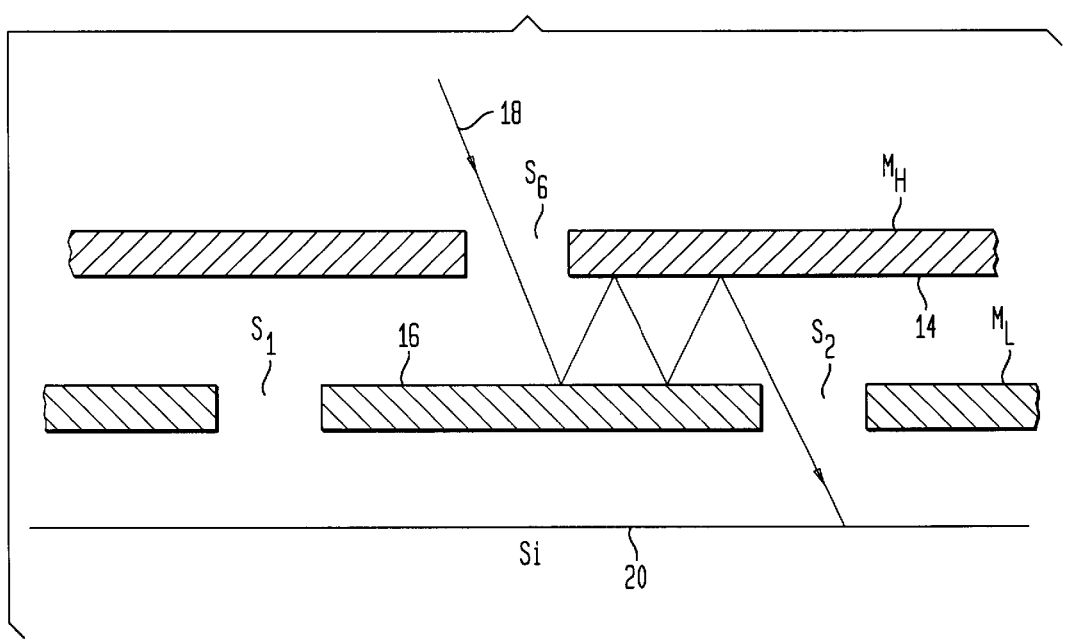
FIG. 3 is a cross-sectional diagram of the layers of metal shielding according to an embodiment of the invention.

FIG. 3 is a cross-sectional view showing layers $M_U$ and $M_L$ located with respect to one another and substrate 20. As can be seen, the slots are located within the layers such that slots within the upper layer $M_U$ are misaligned from slots within the lower layer $M_L$, in order prevent a straight path through which light may reach the substrate 20. Shown in FIG. 3 is slot S6 within layer $M_U$ and slots S1 and S2 within layer $M_L$. Slot S6 is misaligned from slots S1 and S2.

Also shown in FIG. 3 is a ray of light 18 and possible path through slot S6, and then reflected from top surface of lower layer $M_L$ and bottom surface of upper layer $M_U$, together acting as a waveguide, and then through slot S2 to substrate 20. To prevent this from happening, in one embodiment of the present invention, an antireflective coating may be used on at least one of the top surface of the lower layer of metal and the bottom surface of the upper layer of metal. Another feature of the present invention aimed at the prevention of allowing light to reach the substrate are the vias, as is discussed below.

Figure 4:
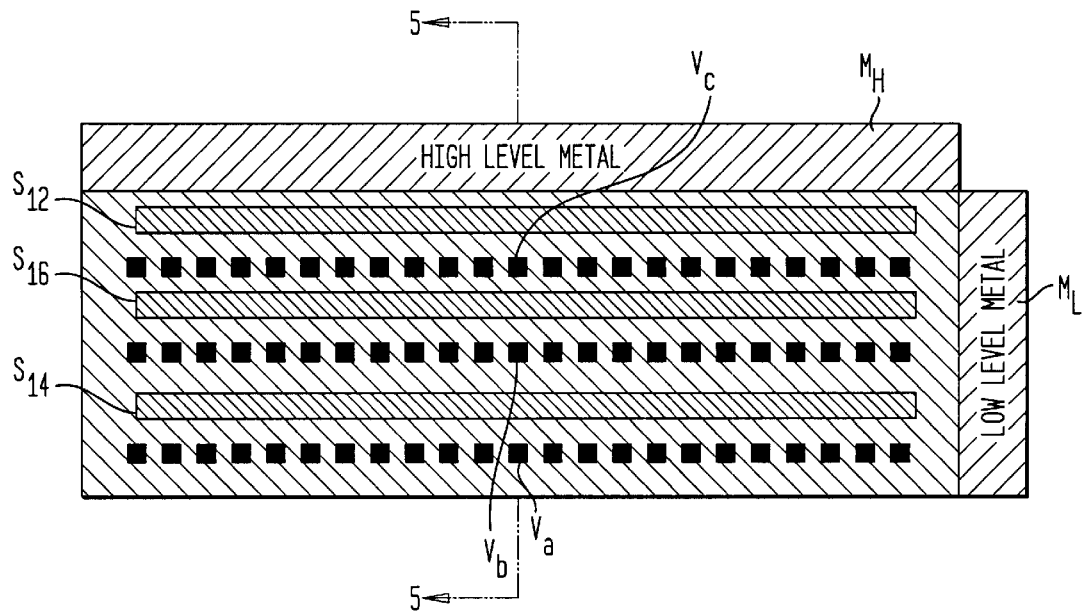
FIG. 4 is a diagram illustrating the alignment of two layers of metal shielding according to an embodiment of the invention.

FIG. 4 is a diagram illustrating the alignment of an upper layer $M_U$ and a lower layer $M_L$ of metal. Slots S12 and S14 are located in the upper layer of metal $M_U$ and slot S16 is located in the lower layer of metal $M_L$.

Figure 5:
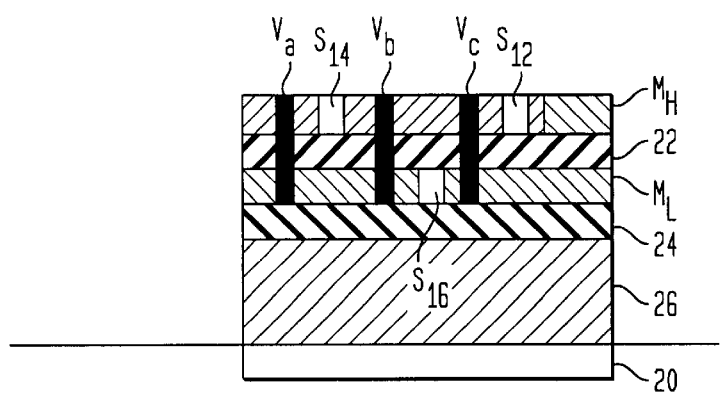
FIG. 5 is a cross-sectional view of the aligned layers taken across lines 5—5 of FIG. 4.

FIG. 5 is a cross sectional view along lines 5—5 of FIG. 4. FIG. 5 better illustrates the alignment of the slots in the two layers of metal. As shown, slot S16 is misaligned from slots S12 and S14. Additionally, shown as black squares are multiple vias. The vias may be located on either side of the slots. Three vias are labeled Va, Vb and Vc. As seen in FIG. 5, the vias interconnect lower layer $M_L$ with upper layer $M_U$ and aid in preventing light from penetrating through the slots to reach the substrate.

In FIG. 5, layer 22, between the upper layer of metal $M_U$ and lower layer of metal $M_L$, is a metal-metal insulator. Layer 24, beneath layer $M_L$ also is a metal-metal insulator. Layer 26, beneath insulator 24, includes metal/polysilicon interconnects and a passivation layer for the pixel cells. Finally, beneath layer 26 is silicon layer 20 of one of the pixel shown and requiring light shielding.

While two layers of metal shielding has been shown, it is envisioned that three or more layers of metal shielding may be used.

In one embodiment, the antireflective coating may include Titanium Nitride ("TiN"). The thickness of the coating depends on the CMOS process used and also on how many layers of metal are used for shielding. For example, for a 0.6 $\mu$m process, each layer of metal requiring shielding would include an antireflective coating of approximately 250 Angstrom ("A") TiN. For a 0.5 $\mu$m process including two layers of metal shielding, the lower layer of metal may include a layer of TiN of approximately 650 A and the upper layer of metal would may include a layer of TiN of approximately 250 A. For a 0.5 μm process including three layers of metal shielding, the bottom two layers may include a layer of TiN of approximately 1650 A and the upper layer may have a layer of TiN of approximately 250 A. In one embodiment of the invention, the layer of TiN may be sputtered on the layer of metal.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto

What is claimed is:

1. A light shield for selectively shielding columns and rows of an array of pixels in a CMOS image sensor comprising:

a first metal layer located above the columns and rows of the array; and a second metal layer located above the first metal layer;

wherein the first and second metal layers together prevent the said columns and rows of the array of pixels from receiving light energy.

2. The light shield as claimed in claim 1 wherein each of the first and second metal layers includes slots.

3. The light shield as claimed in claim 2 wherein the slots are located such that the slots of the first layer are misaligned with the slots of the second layer.

4. The light shield as claimed in claim 2 further including a plurality of vias interconnecting the first and second layers.

5. The light shield as claimed in claim 2 further including an antireflective coating on a top surface of the first layer.

6. The light shield as claimed in claim 5 further including an antireflective coating on a bottom surface of the second layer.

7. The light shield as claimed on one of claims 5 or 6 wherein the antireflective coating includes Titanium Nitride.

8. A CMOS image sensor comprising:

an array of pixels;

a first metal shield layer over certain columns and rows of the array;

a second metal shield layer over the first layer, and a layer of insulation between the metal shield layers;

wherein the first and second metal layer prevent the certain columns and rows of the array from receiving light energy.

9. The CMOS image sensor as claimed in claim 8 wherein each of the first and second metal layers includes slots.

10. The CMOS image sensor as claimed in claim 9 wherein the slots are located such that the slots of the first layer are misaligned with the slots of the second layer.

11. The CMOS image sensor as claimed in claim 9 further including a plurality of vias interconnecting the first and second layers.

12. The CMOS image sensor as claimed in claim 9 further including an antireflective coating on a top surface of the first layer.

13. The CMOS image sensor as claimed in claim 12 further including an antireflective coating on a bottom surface of the second layer.

14. The CMOS image sensor as claimed on one of claims 12 and 13 wherein the antireflective coating includes Titanium Nitride.

15. A light shield for selectively shielding columns and rows of an array of pixels in a CMOS image sensor comprising:

a first metal layer located above the columns and rows of the array;

a second metal layer located above the first metal layer; and each of the first and second metal layers including slots and the slots being located such that the slots of the first layer are misaligned with the slots of the second layer.

16. The light shield as claimed in claim 15 further including a plurality of vias interconnecting the first and second layers.

17. The light shield as claimed in claim 15 further including an antireflective coating on a top surface of the first layer.

18. The light shield as claimed in claim 17 further including an antireflective coating on a bottom surface of the second layer.

19. The light shield as claimed on one of claims 17 or 18 wherein at least one of the antireflective coating includes Titanium Nitride.

20. A light shield for selectively shielding pixels in a CMOS image sensor comprising:

a first metal layer located above said pixels;

a second metal layer located above the first metal layer; and each of the first and second metal layers including slots and the slots being located such that the slots of the first layer are misaligned with the slots of the second layer.

21. The light shield as claimed in claim 20 further including a plurality of vias interconnecting the first and second layers.

22. The light shield as claimed in claim 20 further including an antireflective coating on a top surface of the first layer.

23. The light shield as claimed in claim 22 further including an antireflective coating on a bottom surface of the second layer.

24. The light shield as claimed on one of claims 22 or 23 wherein at least one of the antireflective coating includes Titanium Nitride.

* * * * *